United States Patent
Kurobe et al.

(10) Patent No.: US 10,439,609 B2
(45) Date of Patent: Oct. 8, 2019

(54) REDUNDANT TOUCH SWITCH USING INDUCTION PROXIMITY SENSORS

(71) Applicant: FANUC Corporation, Yamanashi (JP)

(72) Inventors: Yoshiaki Kurobe, Yamanashi (JP); Hiroyuki Suwa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 346 days.

(21) Appl. No.: 15/238,776

(22) Filed: Aug. 17, 2016

(65) Prior Publication Data

US 2017/0052633 A1 Feb. 23, 2017

(30) Foreign Application Priority Data

Aug. 20, 2015 (JP) .................... 2015-162700

(51) Int. Cl.
*H03K 17/95* (2006.01)
*H03K 17/97* (2006.01)

(52) U.S. Cl.
CPC ....... *H03K 17/9502* (2013.01); *H03K 17/953* (2013.01); *H03K 17/97* (2013.01); *H03K 2017/9706* (2013.01)

(58) Field of Classification Search
CPC .... G06F 3/046; H01H 36/00; H01H 36/0033; H01H 36/004; H03K 17/9502; H03K 17/953; H03K 2017/9706
See application file for complete search history.

(56) References Cited

U.S. PATENT DOCUMENTS

| | | | | |
|---|---|---|---|---|
| 6,104,592 A * | 8/2000 | Pohl | ........................ | H01H 71/04 324/207.15 |
| 7,906,875 B2 * | 3/2011 | Caldwell | ................ | A47B 57/00 200/600 |
| 2010/0045360 A1 | 2/2010 | Howard et al. | | |
| 2011/0084933 A1* | 4/2011 | Curtis | ..................... | G06F 3/046 345/174 |
| 2011/0096008 A1 | 4/2011 | Furukawa | | |
| 2013/0271158 A1 | 10/2013 | Thoss et al. | | |

FOREIGN PATENT DOCUMENTS

| | | |
|---|---|---|
| CN | 2052842 U | 2/1990 |
| CN | 101271796 A | 9/2008 |
| CN | 103378836 A | 10/2013 |
| DE | 102014226976 A1 | 6/2016 |

(Continued)

OTHER PUBLICATIONS

Office Action in JP Application No. 2015-162700, dated Oct. 31, 2017, 6 pp.

(Continued)

*Primary Examiner* — Vanessa Girardi
(74) *Attorney, Agent, or Firm* — Hauptman Ham, LLP

(57) ABSTRACT

A touch switch includes a touch input section, a metal piece provided to the touch input section at a surface thereof, and at least two induction-type proximity sensors so provided as to face the metal piece. The induction-type proximity sensors are arranged in parallel to each other and each have an LC oscillation circuit that output signals that changes in accordance with the distance to the metal piece. A duplicated touch switch that requires no stroke and achieves switch duplication is thus provided.

7 Claims, 2 Drawing Sheets

(56) References Cited

FOREIGN PATENT DOCUMENTS

| JP | 51-15166 A | 2/1976 |
| JP | 51-20576 A | 2/1976 |
| JP | 57-115732 A | 7/1982 |
| JP | 5-33419 U | 4/1993 |
| JP | 3179471 U | 11/2012 |

OTHER PUBLICATIONS

Office Action in CN Application No. 201610686940.X, dated Sep. 4, 2018, 14pp.
Office Action in DE Application No. 102016115145.9, dated May 7, 2019, 9pp.

\* cited by examiner

REDUNDANT TOUCH SWITCH USING INDUCTION PROXIMITY SENSORS

RELATED APPLICATIONS

The present application claims priority to Japanese Patent Application Number 2015-162700, filed Aug. 20, 2015, the disclosure of which is hereby incorporated by reference herein in its entirety.

BACKGROUND OF THE INVENTION

1. Field of the Invention

The present invention relates to a duplicated touch switch that requires no stroke and achieves switch duplication.

2. Description of the Related Art

Some switches provided on the operation board of a machine tool and other apparatus are used to command the machine to start and stop operation and emergently stop a driven section in case of emergency. The reliability and safety of such a switch itself are regarded as important features, and the switch is duplicated (two switch systems are provided) for improvement in the reliability and safety.

FIG. 5 is a schematic configuration diagram showing an example of the duplicated switch.

A duplicated switch 1 shown in FIG. 5 has a structure in which an operation button 2 is pressed down in the direction indicated by the arrow in FIG. 5 to apply pressure onto a contact 21 on a first switch system and a contact 22 on a second switch system so that the contacts 21 and 22 are closed. Therefore, even when one of the switch systems formed of the contacts 21 and 22 fails, the duplicated switch 1 can be used with no problem as long as the other switch system normally functions.

As a related-art technology of a duplicated switch configured in consideration of reliability and safety, for example, Japanese Registered Utility Model No. 3,179,471 (JP 3,179,471 U) discloses, for example, a membrane switch in which contacts on a plurality of switch systems are provided in each layer. The duplicated switch of the related art is a switch that requires a fixed stroke.

The duplicated switch of the related art, which requires a fixed stroke as described above, cannot be formed of a touch switch. A keyboard or an operation board using the duplicated switch therefore has a problem of restricted operability and exterior appearance.

SUMMARY OF THE INVENTION

An object of the present invention is to provide a duplicated touch switch that is a touch switch that achieves switch duplication.

A first aspect of a touch switch according to the present invention includes a touch input section, a metal piece provided to the touch input section at a surface thereof, and at least two induction-type proximity sensors facing the metal piece and arranged in parallel to each other. And each of the induction-type proximity sensors has an LC oscillation circuit that provides an output that changes in accordance with a distance to the metal piece.

A second aspect of a touch switch according to the present invention includes a touch input section, a first metal piece provided to the touch input section at a surface thereof, a second metal piece provided in a position separated from the touch input section via a linkage section, and first and second induction-type proximity sensors that include LC oscillation circuits so provided as to face the first and second metal pieces and outputting signals that change in accordance with distances to the metal pieces.

A third aspect of a touch switch according to the present invention includes a touch input section, a metal piece so provided as to be separate from the touch input section via a linkage section, and first and second induction-type proximity sensors that include first and second LC oscillation circuits so provided on opposite sides of the metal piece as to face the metal piece and outputting signals that change in accordance with a distance to the metal piece.

The present invention, in which a duplicated switch keyboard using a touch switch can be achieved by using induction-type proximity sensors, allows improvement in operability of the keyboard and an increase in design flexibility.

BRIEF DESCRIPTION OF THE DRAWINGS

The object and feature of the present invention described above and other objects and features thereof will be apparent from the description of the following embodiments with reference to the accompanying drawings.

DETAILED DESCRIPTION OF THE PREFERRED EMBODIMENTS

According to the present invention, a duplicated switch using a touch switch based on an induction-type proximity sensor is provided.

An example of an induction-type proximity sensor will first be described with reference to FIG. 1.

Figure 1:
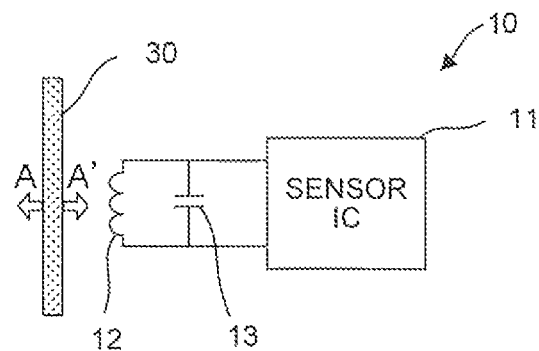
FIG. 1 is a schematic configuration diagram showing an example of an induction-type proximity sensor.

An induction-type proximity sensor 10 is formed of an LC oscillation circuit, which is formed of a coil 12 and a capacitor 13, and a sensor IC 11, which senses the oscillation state of the LC oscillation circuit, as shown in FIG. 1. When a metal piece 30, which is an object to be detected, is brought into proximity to, but not in contact with, the LC oscillation circuit of the induction-type proximity sensor 10, the sensor IC 11 can sense attenuation or pause of the oscillation of the LC oscillation circuit that occurs when the metal piece 30 is displaced in the direction indicated by the arrow A or A' in FIG. 1.

The induction-type proximity sensor 10 can sense the state of the oscillation even when the distance between the metal piece 30 and the LC oscillation circuit changes by as small as about 5 μm and can therefore be used as a touch switch in an application in which bending of an operation surface operated by an operator or a minute change in the position of the operation surface need to be sensed. In the present invention, a duplicated touch switch is achieved by using this induction-type proximity sensor 10.

A duplicated touch switch according to a first embodiment of the present invention will next be described with reference to FIG. 2.

Figure 2:
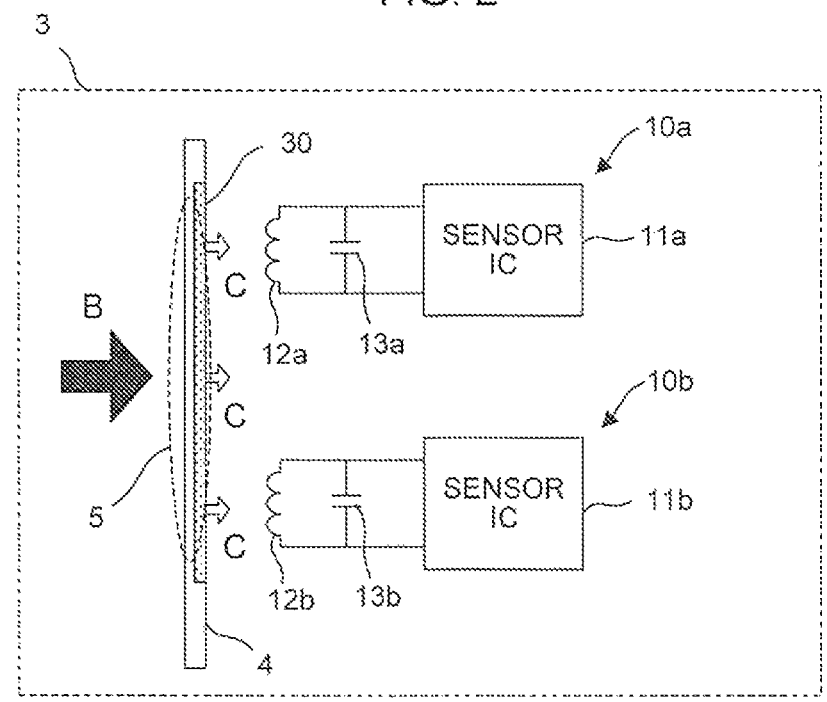
FIG. 2 is a schematic configuration diagram of a duplicated touch switch according to a first embodiment of the present invention.
Figure 5:
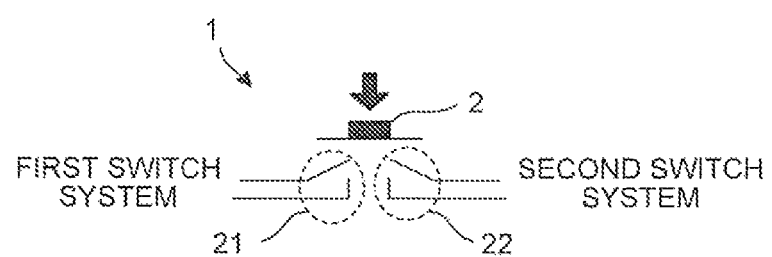
FIG. 5 is a schematic configuration diagram showing an example of a duplicated switch.

A duplicated touch switch 3 according to the present embodiment includes a touch input section 5, which is formed of the metal piece 30 bonded to part of an operation board enclosure 4, and at least two induction-type proximity sensors 10a, 10b, . . . , which are located in the vicinity of the enclosure interior side of the touch input section 5, as shown in FIG. 2.

The touch input section 5 is formed by fitting the metal piece 30 to, burying the metal piece 30 in, or attaching the metal piece 30 to, cover of the operation board enclosure 4. The cover that is part of the operation board enclosure 4 and forms the touch input section 5 is made of a resin or any other elastic material and is therefore elastically deformed by a small amount in the direction indicated by the arrow C in FIG. 2 when the bonded metal piece 30 receives pressure produced by contact of a fingertip or any other object with the touch input section 5 and oriented in the direction indicated by the arrow B in FIG. 2. The elastic deformation changes the distance between the metal piece 30 and LC oscillation circuits (12a, 13a; 12b, 13b) provided in the induction-type proximity sensors 10a, 10b, . . . , and sensor ICs 11a, 11b, . . . sense attenuation or pause of the oscillation of the LC oscillation circuits that occurs due to the change in the distance. Contact of a fingertip or any other object with the touch input section 5 is thus sensed.

The number of induction-type proximity sensors 10a, 10b, . . . provided in one duplicated touch switch 3 is at least two, and the sensor ICs 11a, 11b, . . . , provided in the induction-type proximity sensors 10a, 10b, . . . respectively are connected to different switch systems. Further, the LC oscillation circuits formed of the coils 12a, 12b, . . . , and the capacitors 13a, 13b, . . . in the induction-type proximity sensors 10a, 10b, . . . are disposed in the vicinity of, but not in contact with the metal piece 30, the enclosure interior side of the touch input section 5. Therefore, even when one of the switch systems fails or otherwise malfunctions, the other switch system that works normally can sense that the operator has touched the touch input section 5. Further, even when the position where the operator touches the touch input section 5 is slightly off-center to the periphery, one of the induction-type proximity sensors 10a, 10b, . . . senses the operator's contact operation, whereby the operation can be stably sensed.

A duplicated touch switch according to a second embodiment of the present invention will next be described with reference to FIG. 3.

Figure 3:
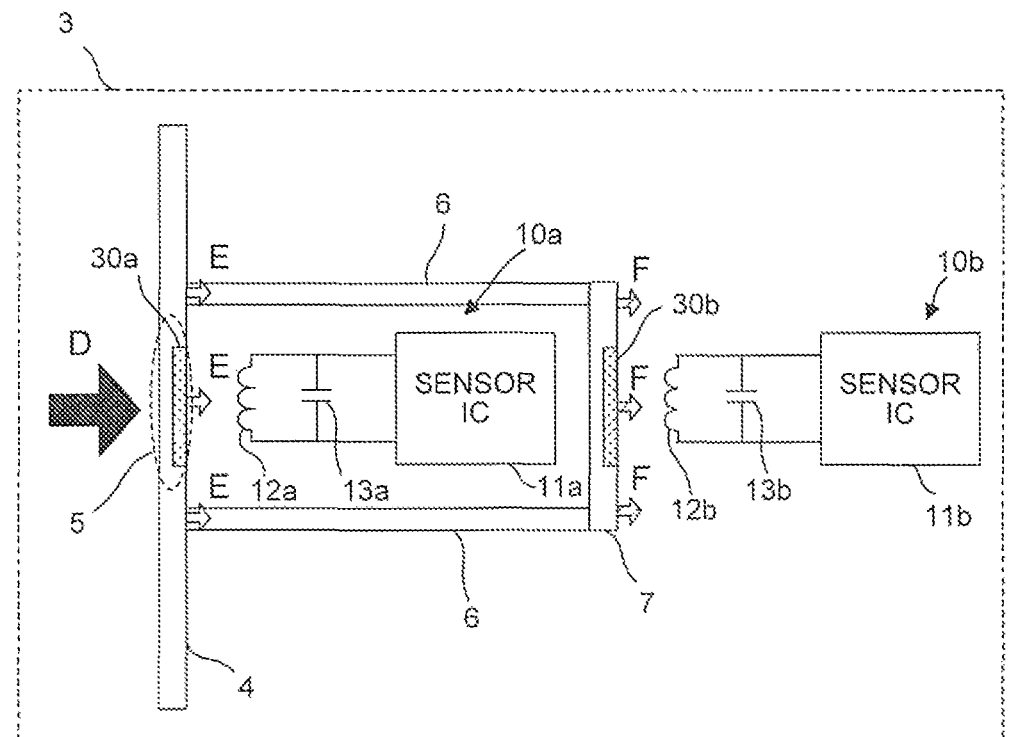
FIG. 3 is a schematic configuration diagram of a duplicated touch switch according to a second embodiment of the present invention.

In a duplicated touch switch 3 according to the present embodiment, the induction-type proximity sensor 10a is disposed in the vicinity of the enclosure interior side of the touch input section 5 including a metal piece 30a, and an auxiliary sensing section 7 is disposed on the enclosure interior side of the induction-type proximity sensor 10a, as shown in FIG. 3. The auxiliary sensing section 7 is then linked with the touch input section 5 via a linkage section 6, and the induction-type proximity sensor 10b is disposed in the vicinity of on the enclosure interior side of the auxiliary sensing section 7. The auxiliary sensing section 7 includes a metal piece 30b, as the touch input section 5 does. The linkage section 6 is made of a material rigid enough to withstand against external pressure, and when the touch input section 5 is displaced in the direction indicated by the arrow E in FIG. 3, the displacement is transmitted to the auxiliary sensing section 7 via the linkage section 6.

The LC oscillation circuit provided in the induction-type proximity sensor 10a is disposed in the vicinity of, but not in contact with, the enclosure interior side of the touch input section 5, and a change in the distance to the metal piece 30a allows the sensor IC 11a to sense attenuation or pause of the oscillation of the LC oscillation circuit.

Similarly, the LC oscillation circuit provided in the induction-type proximity sensor 10b is disposed in the vicinity of, but is not in contact with, the enclosure interior side of the auxiliary sensing section 7, and a change in the distance to the metal piece 30b allows the sensor IC 11b to sense attenuation or pause of the oscillation of the LC oscillation circuit.

The sensor ICs 11a and 11b provided in the induction-type proximity sensors 10a and 10b are connected to different switch systems.

In the thus configured duplicated touch switch 3, when the touch input section 5 receives pressure produced by contact of a fingertip or any other object with the touch input section 5 and oriented in the direction indicated by the arrow D in FIG. 3, the touch input section 5 is elastically deformed by a small amount in the direction indicated by the arrow E in FIG. 3, and the displacement of the touch input section 5 due to the elastic deformation is transmitted to the auxiliary sensing section 7 via the linkage section 6. As a result, the auxiliary sensing section 7 is slightly displaced in the direction indicated by the arrow F in FIG. 3, and the distance between the metal piece 30a and the LC oscillation circuit provided in the induction-type proximity sensor 10a and the distance between the metal piece 30b and the LC oscillation circuit provided in the induction-type proximity sensor 10b change, respectively. Sensing attenuation or pause of the oscillation of the LC oscillation circuits due to the changes in the distances, the sensor ICs 11a and 11b can sense that a fingertip or any other object has touched the touch input section 5.

Therefore, even when one of the switch systems fails or otherwise malfunctions, the other switch system that works normally can sense that the operator has touched the touch input section 5. Further, in the embodiment, the plurality of induction-type proximity sensors 10a, 10b, . . . are not required to be arranged in parallel to each other, as compared with the first embodiment described above with reference to FIG. 2, the area of the touch input section 5 can be reduced.

A duplicated touch switch according to a third embodiment of the present invention will next be described with reference to FIG. 4.

Figure 4:
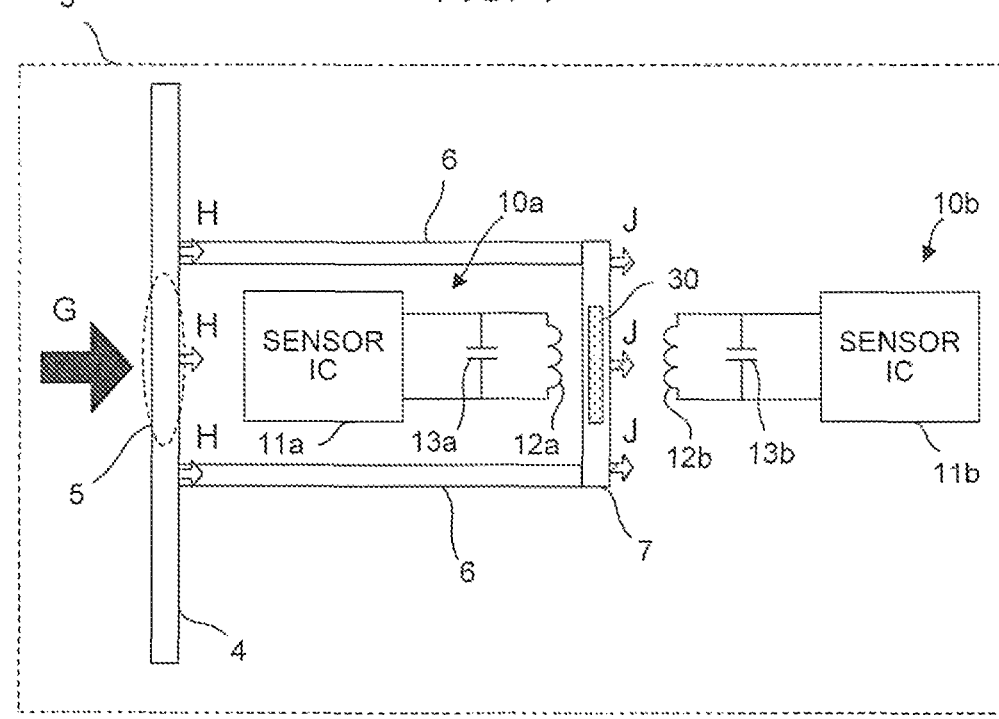
FIG. 4 is a schematic configuration diagram of a duplicated touch switch according to a third embodiment of the present invention.

In a duplicated touch switch 3 according to the present embodiment, the auxiliary sensing section 7 is disposed on the enclosure interior side of the touch input section 5, the auxiliary sensing section 7 is linked with the touch input section 5 via the linkage section 6, and the induction-type proximity sensors 10a and 10b are disposed in the vicinity of the enclosure exterior side and in the vicinity of the enclosure interior side of the auxiliary sensing section 7, respectively, as shown in FIG. 4. The auxiliary sensing section 7 includes the metal piece 30. The linkage section 6 is made of a material rigid enough to withstand against external pressure, and when the touch input section 5 is displaced in the direction indicated by the arrow H in FIG. 4, the displacement is transmitted to the auxiliary sensing section 7 via the linkage section 6.

The LC oscillation circuit provided in the induction-type proximity sensor 10a is disposed in the vicinity of, but not in contact with, the enclosure exterior side of the auxiliary sensing section 7, and a change in the distance to the metal 30 allows the sensor IC 11a to sense attenuation or pause of the oscillation of the LC oscillation circuit.

Similarly, the LC oscillation circuit provided in the induction-type proximity sensor 10b is disposed in the vicinity of, but not in contact with, the enclosure interior side of the auxiliary sensing section 7, and the change in the distance to the metal 30 allows the sensor IC 11b to sense attenuation or pause of the oscillation of the LC oscillation circuit.

The sensor ICs 11a and 11b provided in the induction-type proximity sensors 10a and 10b are connected to different switch systems.

In the thus configured duplicated touch switch 3, when the touch input section 5 receives pressure produced by contact of a fingertip or any other object with the touch input section 5 and oriented in the direction indicated by the arrow G in FIG. 4, the touch input section 5 is elastically deformed by a small amount in the direction indicated by the arrow H in FIG. 4. The displacement of the touch input section 5 due to the elastic deformation is transmitted to the auxiliary sensing section 7 via the linkage section 6, and the auxiliary sensing section 7 is slightly displaced in the direction indicated by the arrow J in FIG. 4. As a result, the distance between the metal piece 30 and the LC oscillation circuit provided in the induction-type proximity sensor 10a changes, and the distance between the metal piece 30 and the LC oscillation circuit provided in the induction-type proximity sensor 10b changes. Sensing attenuation or pause of the oscillation of the LC oscillation circuits due to the changes in the distances, the sensor ICs 11a and 11b can sense that a fingertip or any other object has touched the touch input section 5.

Therefore, even when one of the switch systems fails or otherwise malfunctions, the other switch system that works normally can sense that the operator has touched the touch input section 5. Further, the induction-type proximity sensors 10a and 10b are not required to be arranged in parallel to each other, as compared with the first embodiment, the area of the touch input section 5 can be reduced.

The embodiments of the present invention have been described above, but the present invention is not limited only to the embodiments described above and can be implemented in a variety of aspects with appropriate changes made to the embodiments.

The invention claimed is:

1. A touch switch comprising:
   first and second induction-type proximity sensors that include first and second LC oscillation circuits, respectively;
   a touch input section;
   a linkage section;
   a first metal piece provided to the touch input section at a surface thereof; and
   a second metal piece provided in a position separated from the touch input section via the linkage section to be moveable (i) together with the first metal piece and (ii) relative to the second LC oscillation circuit,
   the first and second LC oscillation circuits facing the first and second metal pieces, respectively, and outputting signals that change in accordance with distances to the first and second metal pieces, respectively.

2. The touch switch of claim 1, wherein
   the first metal piece is attached to or embedded in the touch input section, and
   the linkage section is linked with the touch input section to transmit a displacement of the touch input section and the first metal piece to the second metal piece.

3. The touch switch of claim 2, wherein
   in response to the displacement of the touch input section, the first and second metal pieces are moved together and relative to the first and second LC oscillation circuits, respectively, to cause changes in the distances from the first and second metal pieces to the first and second LC oscillation circuits, respectively,
   said changes in the distances causing attenuation or pause of oscillations of the first and second LC oscillation circuits.

4. The touch switch of claim 3, wherein
   the first and second induction-type proximity sensors further include first and second sensor ICs, respectively, coupled to the first and second LC oscillation circuits, respectively,
   the first and second sensor ICs configured to sense the attenuation or pause of the oscillations of the first and second LC oscillation circuits, respectively.

5. The touch switch of claim 1, wherein
   the touch input section includes an elastically deformable material, and
   the first metal piece is attached to or embedded in the elastically deformable material of the touch input section.

6. The touch switch of claim 5, wherein
   the linkage section is linked with the touch input section to transmit a displacement of the touch input section and the first metal piece to the second metal piece, said displacement caused by an elastic deformation of the elastically deformable material, and
   in response to the displacement of the touch input section, the first and second metal pieces are moved together and relative to the first and second LC oscillation circuits, respectively, to cause changes in the distances from the first and second metal pieces to the first and second LC oscillation circuits, respectively, said changes in the distances causing attenuation or pause of oscillations of the first and second LC oscillation circuits.

7. The touch switch of claim 6, wherein
   the first and second induction-type proximity sensors further include first and second sensor ICs, respectively, coupled to the first and second LC oscillation circuits, respectively,
   the first and second sensor ICs configured to sense the attenuation or pause of the oscillations of the first and second LC oscillation circuits, respectively.

* * * * *